United States Patent
Wu (10) Patent No.: US 10,042,004 B2
(45) Date of Patent: Aug. 7, 2018

(54) APPARATUS USED WITH PROCESSOR OF PORTABLE DEVICE AND ARRANGED FOR PERFORMING AT LEAST ONE PART OF FUEL GAUGE OPERATION FOR BATTERY BY USING HARDWARE CIRCUIT ELEMENT(S) WHEN PROCESSOR ENTER SLEEP MODE

(71) Applicant: MEDIATEK INC., Hsin-Chu (TW)

(72) Inventor: Jui-Chi Wu, Taichung (TW)

(73) Assignee: MediaTek Inc., Hsin-Chu (TW)

( * ) Notice: Subject to any disclaimer, the term of this patent is extended or adjusted under 35 U.S.C. 154(b) by 138 days.

(21) Appl. No.: 14/935,439

(22) Filed: Nov. 8, 2015

(65) Prior Publication Data

US 2016/0238663 A1 Aug. 18, 2016

Related U.S. Application Data

(60) Provisional application No. 62/115,154, filed on Feb. 12, 2015.

(51) Int. Cl.
*G01N 27/416* (2006.01)
*G01R 31/36* (2006.01)

(52) U.S. Cl.
CPC ..... *G01R 31/3662* (2013.01); *G01R 31/3651* (2013.01)

(58) Field of Classification Search
USPC ....................................................... 324/430
See application file for complete search history.

(56) References Cited

U.S. PATENT DOCUMENTS

| 6,789,026 B2 | 9/2004 | Barsoukov |
| 6,832,171 B2 | 12/2004 | Barsoukov |
| 6,892,148 B2 | 5/2005 | Barsoukov |

(Continued)

FOREIGN PATENT DOCUMENTS

| CN | 101494392 A | 7/2009 |
| CN | 101971043 A | 2/2011 |

(Continued)

OTHER PUBLICATIONS

Wu, Title of Invention: Systems and Methods for Determining a Remaining Battery Capacity of a Battery Device, U.S. Appl. No. 13/605,857, filed Sep. 6, 2012.

*Primary Examiner* — Robert Grant
(74) *Attorney, Agent, or Firm* — Wolf, Greenfield & Sacks, P.C.

(57) ABSTRACT

An apparatus used with a processor to perform fuel gauge operation for a battery of a portable device includes a voltage measuring circuit and a control circuit. The voltage measuring circuit periodically measures and records a battery pack voltage for the battery according to time information received from the processor after the processor enters a sleep mode. The control circuit generates an accumulation result by calculating and accumulating at least one value of battery characteristics according to the battery pack voltage, and compares the accumulation result with a reference threshold of battery characteristics to determine whether to trigger an interrupt to wake up the processor, so as to cause the processor to update a battery cell voltage and an internal battery resistance of the battery for performing fuel gauge operation.

10 Claims, 4 Drawing Sheets

(56) References Cited

U.S. PATENT DOCUMENTS

| | | |
|---|---|---|
| 7,352,156 B2 | 4/2008 | Ashizawa |
| 7,685,449 B2 | 3/2010 | Terasawa |
| 8,258,753 B2 | 9/2012 | Akabori |
| 8,548,761 B2 | 10/2013 | Lim |
| 2006/0219447 A1 | 10/2006 | Saitou et al. |
| 2007/0188146 A1* | 8/2007 | Nakano ................ H02J 7/0047 320/132 |
| 2009/0189547 A1 | 7/2009 | Spartano |
| 2009/0189548 A1 | 7/2009 | Hoffman |
| 2010/0085016 A1* | 4/2010 | Kim ..................... H02J 7/0031 320/136 |
| 2010/0156356 A1 | 6/2010 | Asakura |
| 2010/0280777 A1 | 11/2010 | Jin |
| 2011/0084702 A1 | 4/2011 | Mori |
| 2012/0029851 A1* | 2/2012 | Nakayama ......... G01R 31/3624 702/63 |

FOREIGN PATENT DOCUMENTS

| | | |
|---|---|---|
| CN | 101990641 A | 3/2011 |
| CN | 102645571 A | 8/2012 |
| EP | 1321773 A1 | 6/2003 |
| EP | 1707974 A1 | 10/2006 |
| EP | 2 213 939 B1 | 3/2012 |
| JP | 2003244802 A | 8/2003 |
| JP | 2008151745 A | 7/2008 |
| WO | 2006121289 A1 | 11/2006 |

\* cited by examiner

APPARATUS USED WITH PROCESSOR OF PORTABLE DEVICE AND ARRANGED FOR PERFORMING AT LEAST ONE PART OF FUEL GAUGE OPERATION FOR BATTERY BY USING HARDWARE CIRCUIT ELEMENT(S) WHEN PROCESSOR ENTER SLEEP MODE

CROSS REFERENCE TO RELATED APPLICATIONS

This application claims the benefit of U.S. Provisional Application No. 62/115,154, which was filed on Feb. 12, 2015.

BACKGROUND

The present invention relates to a fuel gauge operation scheme, and more particularly to a scheme for providing an apparatus used with a processor of a portable device to perform at least one part of fuel gauge operation for a battery of the portable device when the processor enters a sleep mode.

Generally speaking, a conventional scheme for performing fuel gauge operation for a battery may be completely implemented and achieved by using software applications/operations running on a processor of a portable device. This can calculate power consumption caused by the software applications/operations and thus estimate the available power of the battery. In some situations, the processor may enter a sleep mode to save power, and the software applications/operations are deactivated. However, some peripheral circuits within the portable device are not disabled and may still consume power from the battery. As a result, the conventional scheme cannot perform fuel gauge operation for the battery since the software applications/operations are deactivated.

SUMMARY

It is therefore one of the objectives of the present invention to provide an apparatus used with a processor of a portable device to perform at least one part of fuel gauge operation for a battery of the portable device when the processor goes to sleep, solve the above-mentioned problems.

According to embodiments of the present invention, an apparatus used with a processor of a portable device to perform fuel gauge operation for a battery of the portable device is disclosed. The apparatus comprises a voltage measuring circuit and a control circuit. The voltage measuring circuit is configured for periodically measuring and recording a battery pack voltage for the battery according to time information received from the processor of the portable device after the processor enters a sleep mode from a non-sleep mode. The control circuit is coupled to the voltage measuring circuit and configured for generating an accumulation result by calculating and accumulating at least one value of battery characteristics according to the battery pack voltage periodically measured and recorded, and for comparing the accumulation result with a reference threshold of the battery characteristics to determine whether to trigger an interrupt to wake up the processor, so as to cause the processor to update a battery cell voltage and an internal battery resistance of the battery for performing fuel gauge operation for the battery.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
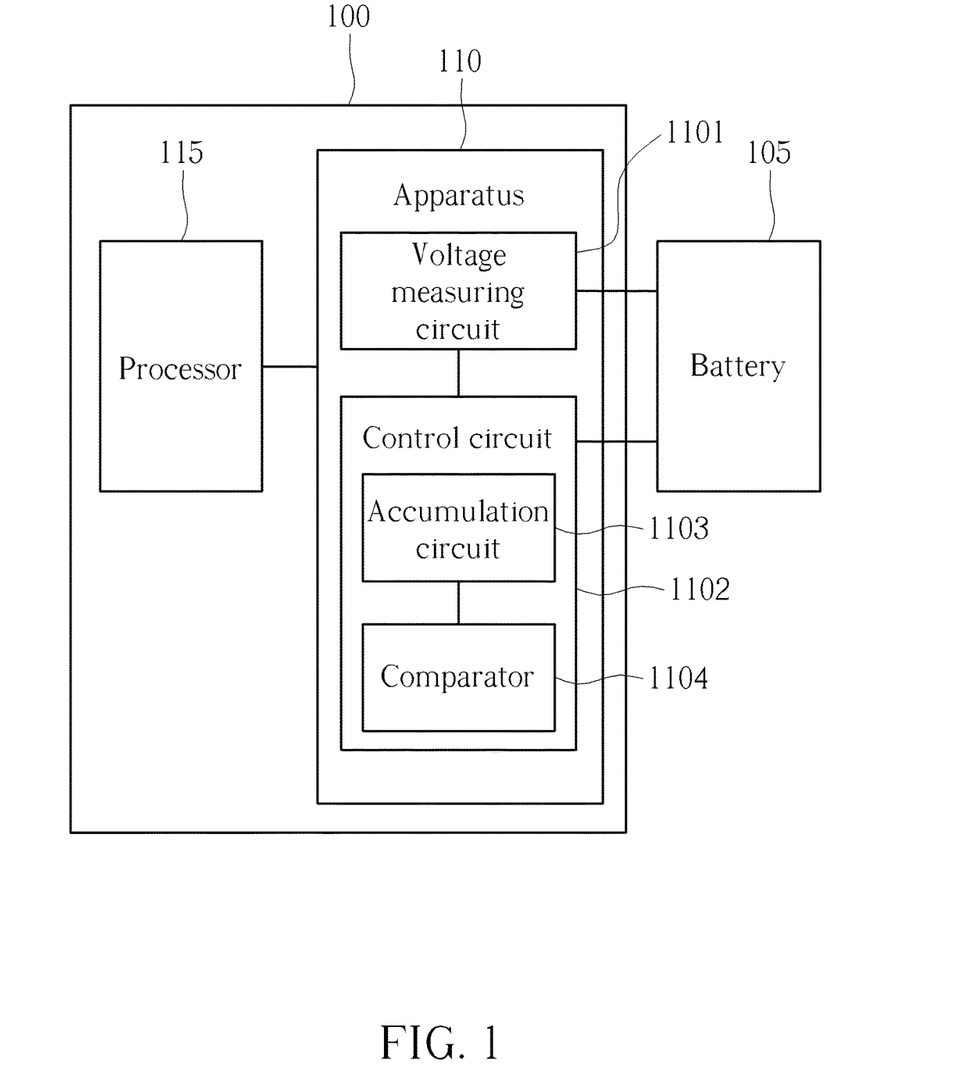
FIG. 1 is a diagram of an apparatus used with a processor of a portable device to perform fuel gauge operation for a battery of the portable device according to embodiments of the present invention.

Please refer to FIG. 1, which is a diagram of an apparatus 110 used with a processor 115 of a portable device 100 to perform fuel gauge operation for a battery 105 connected to the portable device 100 according to embodiments of the present invention. The portable device 100 comprises the apparatus 110 and the processor 115, and the battery 105 is used for providing energy/power for the portable device 100. The processor 115 is used for executing/performing various software applications/programs/operations. In the embodiments, the processor 115 of the portable device 100 is arranged to execute software application(s)/program(s) under a non-sleep mode, and to go to sleep after entering a sleep mode from the non-sleep mode to save power. The sleep mode may indicate the power saving mode or low power mode, and the non-sleep mode indicates the normal operation mode. This is not meant to be a limitation of the present invention. In addition, the apparatus 110 for example is a power management circuit or can be a circuit included within a power management circuit. The power management circuit can be configured at the side of portable device 100; however, this is not intended to be a limitation of the present invention. The apparatus 110 is used with the processor 115 to perform the fuel gauge operation for the battery 105. When operating under the non-sleep mode, the processor 115 executes software applications/programs/operations, controls the apparatus 110 to detect a battery pack voltage VBAT for the battery 105, and performs the fuel gauge operation based on the detected battery pack voltage VBAT. The battery pack voltage VBAT herein indicates a voltage level measured/detected from the outside of the battery 105. A battery cell voltage VZCV indicates that a voltage level that is measured or detected from internal battery cell(s) within the battery 105. The processor 115 under the non-sleep mode can execute software application(s)/operation(s) to detect and calculate the value of current, the battery cell voltage VZCV, and the amount of energy/power currently consumed by the portable device 100. When entering the sleep mode from the non-sleep mode at least one part of the fuel gauge operation that previously performed by the software application(s)/operation(s) running on the processor 115 can be performed/achieved by the apparatus 110 using hardware circuit elements. For example, the apparatus 110 can calculate the value of current passing through the battery 105 and the amount of energy/power currently consumed by portable device 100 by using hardware circuit elements once the processor 115 enters the sleep mode. Once the apparatus 110 decides that it is required for the processor 115 to update the battery cell voltage VZCV and the internal battery resistance RZC, the apparatus 110 is arranged to immediately generate and trigger an interrupt for the processor 115 so as to cause the processor 115 exit the sleep mode and return back to the non-sleep mode for updating the battery cell voltage VZCV and the internal battery resistance RZC. When the processor 115 goes to sleep, the apparatus 110 is configured for performing at least one part of fuel gauge operation based on the battery cell voltage VZCV and internal battery resistance RZC previously have been detected or determined by the processor 115. Thus, even though the processor 115 goes to sleep, the apparatus 100 can still measure and calculate the value of current provided by the battery 105 and the amount of electric charge consumed from the battery 105 so as to detect power consumption from other circuit(s).

Before entering the sleep mode from the non-sleep mode, the processor 115 determines or calculates the battery cell voltage VZCV, the internal battery resistance RZC, the available maximum battery capacity Qmax, and the time information specifying the intervals ΔT for measuring the battery pack voltage VBAT. The processor 115 then transmits the battery cell voltage VZCV, the internal battery resistance RZC, the available maximum battery capacity Qmax, and the time information to the apparatus 110. After the processor 115 has entered the sleep mode, the apparatus 110 is arranged for monitoring the condition of battery 105 and timely waking up the processor 115 if needed so that the processor 115 can timely update the battery cell voltage VZCV and the internal battery resistance RZC. Since the apparatus 110 can monitor the condition of the battery 105 when the processor 115 operates under the sleep mode, this can precisely calculate power consumption of the battery 105. The apparatus 110 is arranged to dynamically measure the consumed power/energy of the battery 105 when the processor 115 enters the sleep mode form the non-sleep mode, and to notify the processor 115 of that the energy of the battery 105 has been consumed to a certain extent such as one-hundredth of the available maximum battery capacity Qmax, to wake up the processor 115 so that the processor 115 can immediately update the battery cell voltage VZCV and the internal battery resistance RZC for the battery 105.

In practice, the apparatus 110 comprises a voltage measuring circuit 1101 and a control circuit 1102. The voltage measuring circuit 1101 is arranged for periodically measuring and recording the battery pack voltage VBAT for the battery 105 according to time information received from the processor 115 of the portable device 100 after the processor 115 enters the sleep mode from the non-sleep mode. The time information specifies intervals ΔT for measuring the battery pack voltage VBAT. The control circuit 1102 is coupled to the voltage measuring circuit 1101 and arranged for generating an accumulation result by calculating and accumulating at least one value of battery characteristics according to the battery pack voltage VBAT periodically measured and recorded and also arranged for comparing the accumulation result with a reference threshold of the battery characteristics to determine whether to trigger an interrupt to wake up the processor 115, so as to cause the processor 115 to update the battery cell voltage VZCV and the internal battery resistance RZC of the battery 105 for performing fuel gauge operation for the battery 105. That at least one value of battery characteristics comprises at least one of amount of electric charge, a voltage difference between the battery pack voltage VBAT and battery cell voltage VZCV, and the level of battery pack voltage VBAT. However, this is not intended to be a limitation of the present invention.

Figure 2:
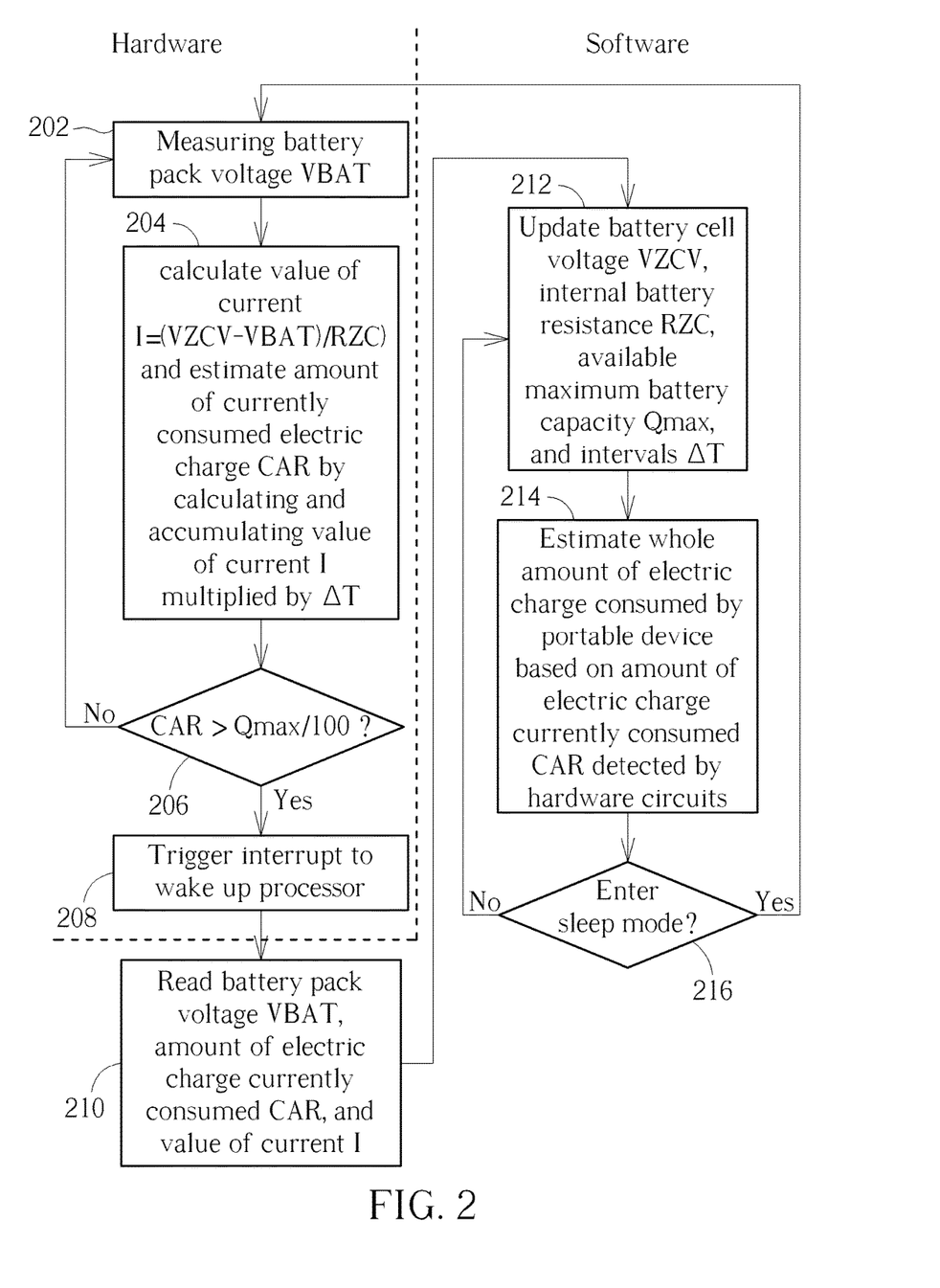
FIG. 2 is a flowchart illustrating the relation between the hardware operations of apparatus and software operations executed by the processor as shown in FIG. 1 according to the first embodiment.

In practice, the control circuit 1102 comprises an accumulator circuit 1103 and a comparator 1104. The accumulator circuit 1103 can be implemented by using different hardware circuit elements in various embodiments. In a first embodiment, the accumulator circuit 1103 is implemented by using an electric charge accumulator circuit configured for generating the accumulation result by calculating and accumulating the amount of electric charge currently consumed. Please refer to FIG. 1 in conjunction with FIG. 2. FIG. 2 is a flowchart illustrating the relation between the hardware operations of apparatus 110 and software operations executed by the processor 115 as shown in FIG. 1 according to the first embodiment. Initially it is assumed that the processor 115 enters the sleep mode and apparatus 110 starts to operate; however, this is not intended to be a limitation of the present invention. As mentioned above, in Step 202, the voltage measuring circuit 1101 is arranged for automatically and periodically measuring the battery pack voltage VBAT according to a specific time period ΔT indicated by the time information received from the processor 115. That is, the voltage measuring circuit 1101 measures the battery pack voltage VBAT at intervals of ΔT. Each time when the voltage measuring circuit 1101 measures the battery pack voltage VBAT, in Step 204, the accumulator circuit 1103 is arranged to calculate the value of current I passing through the battery 105 by using divider circuit(s) according to the battery cell voltage VZCV, the measured battery pack voltage VBAT, and the internal battery resistance RZC. The accumulator circuit 1103 divides a voltage difference between the battery pack voltage VBAT and battery cell voltage VZCV by the internal battery resistance RZC to derive the value of current I. The value of current I can be represented based on the following equation: $I=(VZCV-VBAT)/RZC$.

After the value of current I has been calculated, in Step 204, the control circuit 1102 is arranged to utilize the accumulator circuit 1103 to calculate/estimate the amount of electric charge CAR consumed by the portable device 100 by calculating and accumulating the value of current I multiplied by the specific time period ΔT each time when the value of current I is calculated and updated, so as to generate the accumulation result. That is, the accumulation result corresponds to the amount of electric charge CAR that is currently consumed by the portable device 100. Each time when the value of current I multiplied by the specific time period ΔT is calculated and accumulated, the comparator 1104 in Step 206 is arranged to compare the accumulation result with a reference threshold TH1 to determine whether to trigger an interrupt for waking up the processor 115. The reference threshold TH1 in the first embodiment is designed and configured according to the available maximum capacity Qmax of the battery 105. For example, the reference threshold TH1 can be configured as one percent of the available maximum capacity Qmax of the battery 105, and the comparator 1104 is arranged to compare the accumulation result (the amount of electric charge CAR that is currently consumed by the portable device 100) with one percent of the available maximum capacity Qmax of the battery 105. When the amount of consumed electric charge CAR is not higher than one percent of the available maximum capacity Qmax of the battery 105, the flow of FIG. 2 proceeds to Step 202. When the consumed amount of electric charge CAR becomes higher than one percent of the available maximum capacity Qmax of the battery 105, the flow of FIG. 2 proceeds to Step 208, and in Step 208 the comparator 1104 is arranged to trigger an interrupt to wake up the processor 115.

The flow of FIG. 2 then switches from hardware operations to software applications/operations. After the processor 115 exits the sleep mode, the processor 115 in Step 210 is arranged to execute software applications/programs to read the battery pack voltage VBAT, amount of electric charge currently consumed, the value of current I that are measured or calculated by the apparatus 110 for the last time. Then, the processor 115 in Step 212 updates the battery cell voltage VZCV, internal battery resistance RZC, value of available maximum battery capacity Qmax, and the intervals $\Delta T$. Based on the calculation of amount of electric charge consumed by hardware circuits, the processor 115 in Step 214 then can calculate the amount of electric charge consumed by the software applications/programs running on the portable device 100 to derive or estimate a whole amount of electric charge currently consumed by portable device 100. In addition, in Step 214, if it is needed, the processor 115 can calculate immediately maximum current value or averagely maximum current value based on the battery pack voltage VBAT, the internal battery resistance RZC, and one of the immediate value of current and the average value of current. In Step 216, the processor 115 decides whether to enter the sleep mode or not. If the processor 115 decides to enter the sleep mode again, the flow of FIG. 2 proceeds to Step 202; otherwise, the flow of FIG. 2 proceeds to Step 212.

Figure 3:
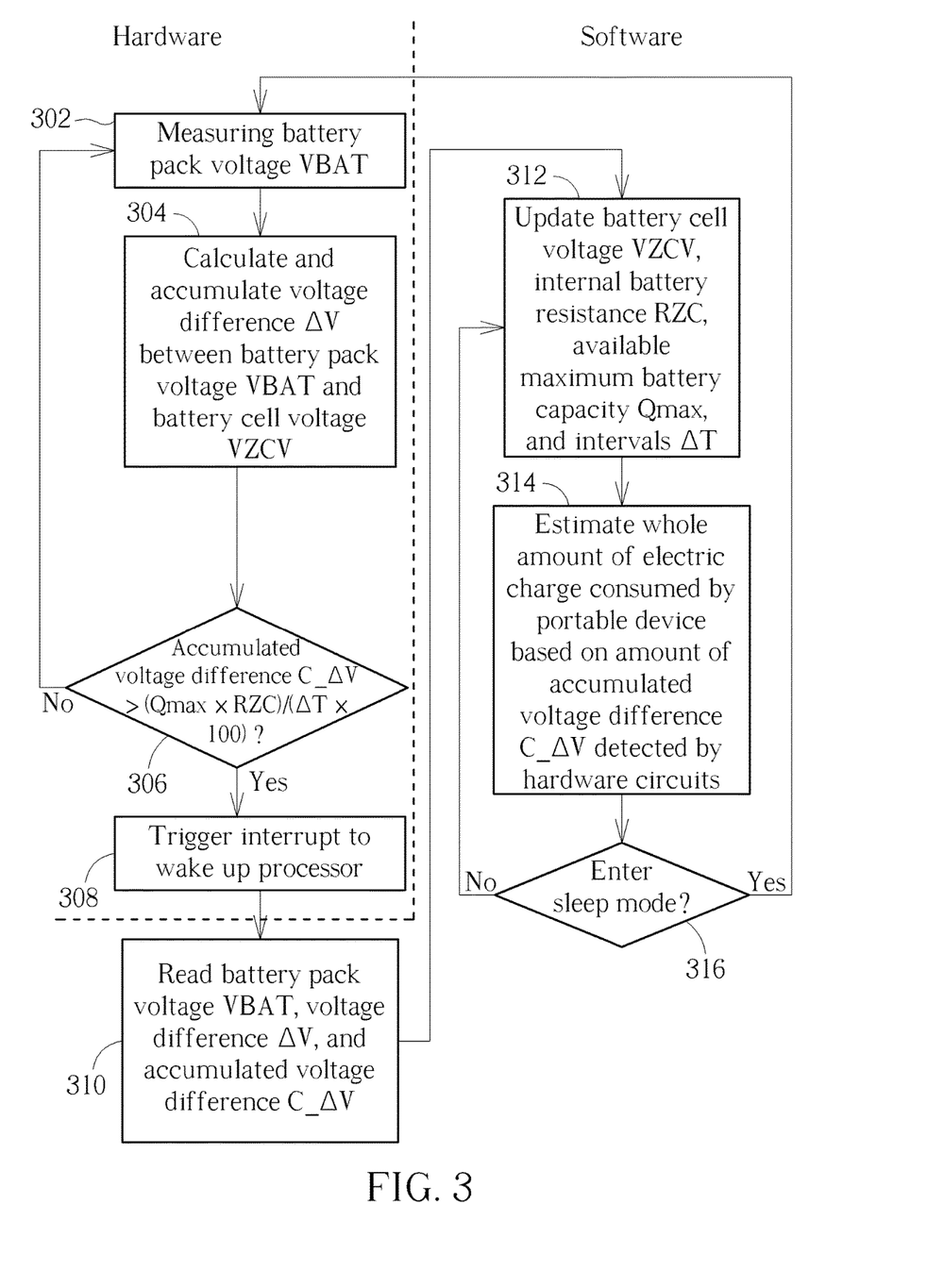
FIG. 3 is a flowchart illustrating the relation between the hardware operations of apparatus and software operations executed by the processor as shown in FIG. 1 according to the second embodiment.

In a second embodiment, the accumulator circuit 1103 is implemented by using a voltage difference accumulator circuit configured for generating the accumulation result by calculating and accumulating the voltage difference between the battery pack voltage VBAT and the battery cell voltage VZCV. Please refer to FIG. 1 in conjunction with FIG. 3. FIG. 3 is a flowchart illustrating the relation between the hardware operations of apparatus 110 and software operations executed by the processor 115 as shown in FIG. 1 according to the second embodiment. It is assumed that initially the processor 115 enters the sleep mode and apparatus 110 starts to operate; however, this is not intended to be a limitation of the present invention. In Step 302, the voltage measuring circuit 1101 is arranged for automatically and periodically measuring the battery pack voltage VBAT according to the specific time period $\Delta T$ indicated by the time information received from the processor 115. That is, the voltage measuring circuit 1101 measures the battery pack voltage VBAT at intervals of the specific time period $\Delta T$. Each time when the voltage measuring circuit 1101 measures the battery pack voltage VBAT, the control circuit 1102 in Step 304 is arranged to calculate and accumulate the voltage difference $\Delta V$ between the battery pack voltage VBAT and battery cell voltage VZCV according to the battery cell voltage VZCV and the measured battery pack voltage VBAT, so as to generate the accumulation result. That is, the accumulation result corresponds to the sum C_$\Delta V$ of voltage differences between the battery cell voltage VZCV and battery pack voltage VBAT. The comparator 1104 in Step 306 is arranged to compare the accumulation result with a reference threshold TH2 to determine whether to trigger an interrupt for waking up the processor 115. The reference threshold TH2 in the second embodiment is designed and configured according to the maximum capacity of the battery 105 and the internal battery resistance RZC.

For example, the reference threshold TH2 can be configured based on the following equation:

$$TH2=(Q\max \times RZC)/(\Delta T \times 100)$$

wherein TH2 indicates the reference threshold in the second embodiment, Qmax indicates available maximum capacity of the battery 105, RZC indicates the internal battery resistance, and $\Delta T$ indicates the interval of specific time period. The comparator 1104 is arranged to compare the accumulation result with the reference threshold TH2. When the accumulation result is higher than the reference threshold TH2, the flow of FIG. 3 proceeds to Step 302. When the accumulation result becomes higher than the reference threshold TH2, the flow of FIG. 3 proceeds to Step 308, and in Step 308 the comparator 1104 is arranged to trigger an interrupt to wake up the processor 115. The flow of FIG. 3 then switches from hardware operations to software applications/operations. After the processor 115 exits the sleep mode, the processor 115 in Step 310 is arranged to execute software applications/programs to read the battery pack voltage VBAT measured by the apparatus 110 for the last time, the accumulated voltage difference, and the voltage difference that is measured for the first time. Then, the processor 115 in Step 312 updates the battery cell voltage VZCV. Accordingly, based on the calculation and accumulation of voltage difference measured by hardware circuits, the processor 115 in Step 314 can calculate the amount of electric charge consumed by the software applications/programs running on the portable device 100 to derive or estimate a whole amount of electric charge currently consumed by portable device 100. In addition, in Step 314, if it is needed, the processor 115 can calculate immediately maximum current value or averagely maximum current value based on the battery pack voltage VBAT, the internal battery resistance RZC, and one of the immediate value of current and the average value of current. In Step 316, the processor 115 decides whether to enter the sleep mode or not. If the processor 115 decides to enter the sleep mode again, the flow of FIG. 3 proceeds to Step 302; otherwise, the flow of FIG. 3 proceeds to Step 312.

Figure 4:
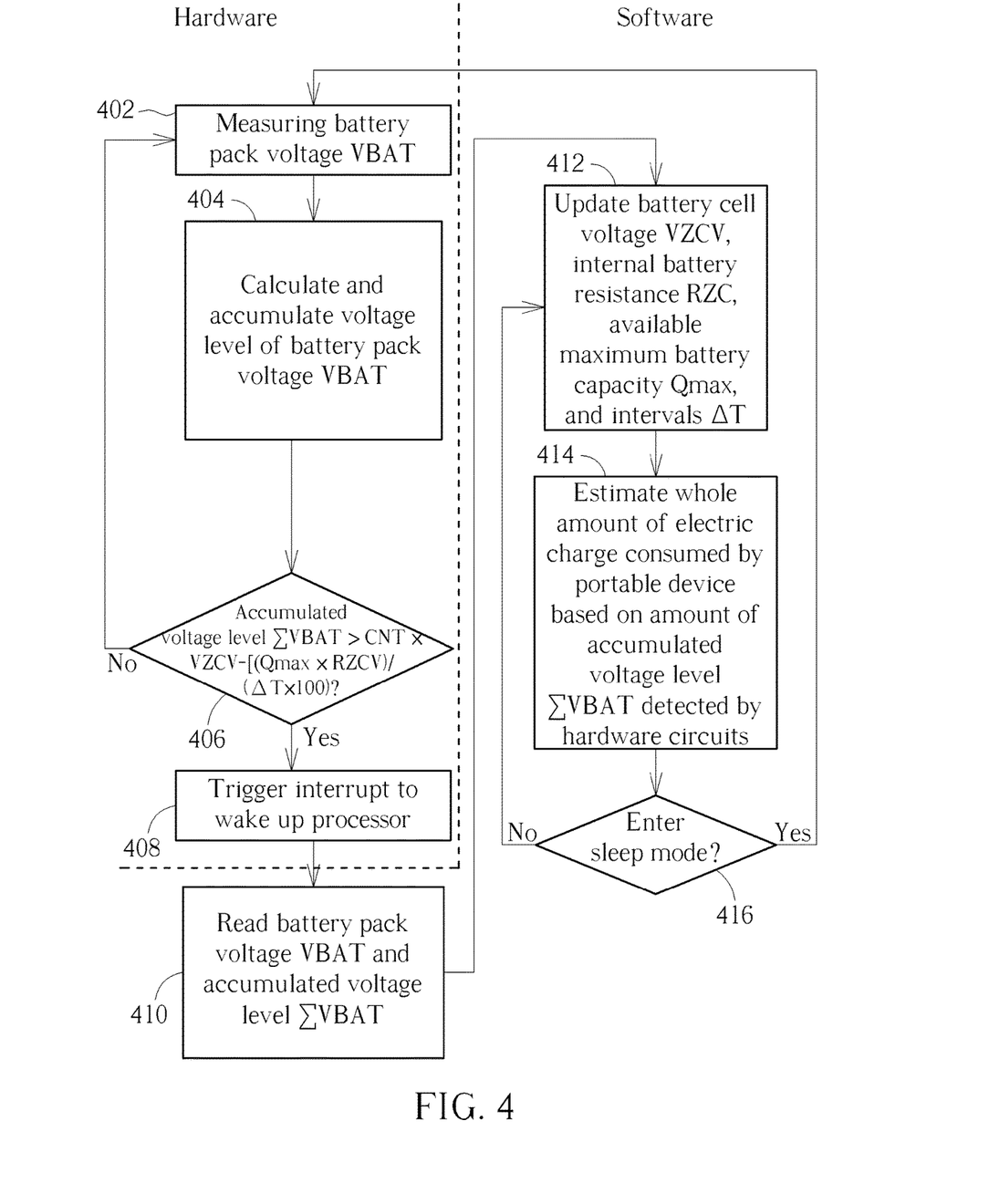
FIG. 4 is a flowchart illustrating the relation between the hardware operations of apparatus and software operations executed by the processor as shown in FIG. 1 according to the third embodiment.

In a third embodiment, the accumulator circuit 1103 is implemented by using a voltage accumulator circuit configured for generating the accumulation result by calculating and accumulating the voltage level of the battery pack voltage VBAT. Please refer to FIG. 1 in conjunction with FIG. 4. FIG. 4 is a flowchart illustrating the relation between the hardware operations of apparatus 110 and software operations executed by the processor 115 as shown in FIG. 1 according to the third embodiment. Initially it is assumed that the processor 115 enters the sleep mode and apparatus 110 starts to operate; however, this is not intended to be a limitation of the present invention. In Step 402, the voltage measuring circuit 1101 is arranged for automatically and periodically measuring the battery pack voltage VBAT according to the specific time period $\Delta T$ indicated by the time information received from the processor 115. That is, the voltage measuring circuit 1101 measures the battery pack voltage VBAT at intervals of the specific time period $\Delta T$. Each time when the voltage measuring circuit 1101 measures the battery pack voltage VBAT, the control circuit 1102 in Step 404 is arranged to calculate and accumulate the voltage level of the battery pack voltage VBAT according to the measured battery pack voltage VBAT, so as to generate the accumulation result. That is, the accumulation result corresponds to the sum $\Sigma$VBAT of voltage levels of the measured battery pack voltage VBAT. The comparator 1104 in Step 406 is arranged to compare the accumulation result with a reference threshold TH3 to determine whether to trigger an interrupt for waking up the processor 115. The reference threshold TH3 in the third embodiment is designed and configured according to the maximum capacity of the battery 105 and the internal battery resistance RZC. For example, the reference threshold TH3 can be configured based on the following equation:

$$TH3 = CNT * VZCV - [(Qmax \times RZC)/(\Delta T \times 100)]$$

wherein TH3 indicates the reference threshold in the third embodiment, CNT indicates a counting number of a counter (but not limited to a coulomb counter) which initially sets the counting number as zero and increases the counting number by one each time when the control circuit 1102 calculates and accumulates the battery pack voltage VBAT during the specific time period $\Delta T$, VZCV indicates the battery cell voltage, Qmax indicates available maximum capacity of the battery 105, RZC indicates the internal battery resistance, and $\Delta T$ indicates the interval of time information. The comparator 1104 is arranged to compare the accumulation result with the reference threshold TH3. When the accumulation result is not higher than the reference threshold TH3, the flow of FIG. 4 proceeds to Step 502. When the accumulation result becomes higher than the reference threshold TH3, the flow of FIG. 4 proceeds to Step 508, and in Step 508 the comparator 1104 is arranged to trigger an interrupt to wake up the processor 115. The flow of FIG. 4 then switches from hardware operations to software applications/operations. After the processor 115 exits the sleep mode, the processor 115 in Step 410 is arranged to execute software applications/programs to read the battery pack voltage VBAT measured by the apparatus 110 for the last time, the accumulated voltage level for battery pack voltage VBAT, and the voltage level of VBAT that is measured for the first time. Then, the processor 115 in Step 412 updates the battery cell voltage VZCV and the internal battery resistance RZC. Accordingly, based on the calculation and accumulation of voltage levels measured by hardware circuits, the processor 115 in Step 414 can immediately calculate the amount of electric charge consumed by the software applications/programs running on the portable device 100 to derive or estimate a whole amount of electric charge currently consumed by portable device 100. In addition, in Step 414, if it is needed, the processor 115 can calculate immediately maximum current value or averagely maximum current value based on the battery pack voltage VBAT, the internal battery resistance RZC, and one of the immediate value of current and the average value of current. In Step 416, the processor 115 decides whether to enter the sleep mode or not. If the processor 115 decides to enter the sleep mode again, the flow of FIG. 4 proceeds to Step 402; otherwise, the flow of FIG. 4 proceeds to Step 412.

Further, the voltage measuring circuit 1101 as shown in FIG. 1 can be implemented by using auxiliary analog-to-digital (ADC) circuit. However, this is not intended to be a limitation of the present invention. The voltage measuring circuit 1101 can be implemented using other types of circuits.

To summarize, when the processor 115 of the portable device 100 goes to sleep, the apparatus 110 can be activated to utilize its hardware circuit element(s) such as auxiliary analog-to-digital (ADC) circuit(s), divider(s), accumulator circuit(s), and/or comparator(s) for measuring the battery pack voltage VBAT, estimating amount of currently consumed power, accumulated voltage differences, and/or accumulated voltage levels, and deciding whether to wake up the processor 115 by determining if the amount of currently consumed power, accumulated voltage differences, and/or accumulated voltage levels exceed corresponding reference thresholds. Thus, the processor 115 can immediately update the battery cell voltage VZCV and the internal battery resistance RZC after it is waked up. Accordingly, even though the processor 115 goes to sleep, the condition of power consumption for the battery 105 can be still monitored and precisely estimated by hardware circuit element(s).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for waking up a processor of a portable device, the apparatus comprising:
   a voltage measuring circuit, for periodically measuring and recording, when the processor is in a sleep mode, a measured battery pack voltage for the battery according to time information received from the processor;
   a control circuit, coupled to the voltage measuring circuit, for calculating an amount of charge discharged by the battery based on the measured battery pack voltage and for comparing the amount of charge with a reference threshold to determine whether to trigger an interrupt to wake up the processor, so as to cause the processor to measure a battery cell voltage and an internal battery resistance of the battery.

2. The apparatus of claim 1, wherein the control circuit is further configured to calculate a voltage difference between the measured battery pack voltage and the battery cell voltage.

3. The apparatus of claim 1, wherein the control circuit comprises:
   an accumulator circuit, for calculating the amount of charge discharged by the battery; and
   a comparator, coupled to the accumulator circuit, for comparing the amount of charge with the reference threshold to determine whether to trigger the interrupt to wake up the processor of the portable device.

4. The apparatus of claim 3, wherein the accumulator circuit is an electric charge accumulator circuit configured for calculating the amount of charge discharged by the battery.

5. The apparatus of claim 4, wherein the reference threshold is determined by a percentage of electricity for a maximum capacity of the battery.

6. The apparatus of claim 4, wherein the electric charge accumulator circuit is arranged for dividing a voltage difference between the measured battery pack voltage and the battery cell voltage by the internal battery resistance to derive a value of current, and for calculating the amount of charge according to the value of current and the time information received from the processor.

7. The apparatus of claim 3, wherein the control circuit is further configured to calculate a voltage difference between the measured battery pack voltage and the battery cell voltage, and the accumulator circuit is a voltage difference accumulator circuit configured for calculating the amount of charge by calculating and accumulating the voltage difference between the measured battery pack voltage and the battery cell voltage.

8. The apparatus of claim 7, wherein the reference threshold is determined by the internal battery resistance, the time information, and a percentage of electricity for a maximum capacity of the battery.

9. The apparatus of claim 3, wherein the accumulator circuit is a voltage accumulator circuit configured for calculating the amount of charge by calculating and accumulating the measured battery pack voltage.

10. The apparatus of claim 9, wherein the reference threshold is determined by the battery cell voltage, the internal battery resistance, the time information, and a percentage of electricity for a maximum capacity of the battery.

\* \* \* \* \*